(12) United States Patent
Lundahl (10) Patent No.: US 9,672,407 B2
(45) Date of Patent: *Jun. 6, 2017

(54) FINGERPRINT SENSING DEVICE WITH INTERPOSER STRUCTURE

(71) Applicant: Fingerprint Cards AB, Göteborg (SE)

(72) Inventor: Karl Lundahl, Göteborg (SE)

(73) Assignee: FINGERPRINT CARDS AB, Göteborg (SE)

(*) Notice: Subject to any disclaimer, the term of this patent is extended or adjusted under 35 U.S.C. 154(b) by 0 days.

This patent is subject to a terminal disclaimer.

(21) Appl. No.: 15/168,591

(22) Filed: May 31, 2016

(65) Prior Publication Data

US 2016/0358008 A1 Dec. 8, 2016

(51) Int. Cl.
*G06K 9/00* (2006.01)
*G03F 7/16* (2006.01)

(52) U.S. Cl.
CPC ........... *G06K 9/00053* (2013.01); *G03F 7/16* (2013.01)

(58) Field of Classification Search
CPC .... G06K 9/00; G06K 9/0002; G06K 9/00053; G03F 7/16
See application file for complete search history.

(56) References Cited

U.S. PATENT DOCUMENTS

| 8,884,912 B2* | 11/2014 | Otsuki | G06F 3/0416 |
| | | | 178/18.06 |
| 9,460,332 B1* | 10/2016 | Bussat | G06K 9/0002 |
| 9,507,992 B1* | 11/2016 | Lundahl | G06K 9/0002 |
| 9,547,788 B1* | 1/2017 | Ogirko | G06K 9/0002 |
| 9,588,336 B1* | 3/2017 | Boon | G02B 26/005 |
| 2008/0157787 A1* | 7/2008 | Misra | G06K 9/0002 |
| | | | 324/686 |
| 2013/0201153 A1 | 8/2013 | Schneider et al. | |
| 2014/0103943 A1 | 4/2014 | Dunlap et al. | |
| 2016/0354801 A1* | 12/2016 | Lundahl | B05D 1/005 |

* cited by examiner

*Primary Examiner* — John P Dulka
(74) *Attorney, Agent, or Firm* — Remarck Law Group PLC (57) ABSTRACT

The invention relates to a fingerprint sensing device comprising: a sensing chip comprising an array of sensing elements being configured to be connected to readout circuitry for detecting a capacitive coupling between each of the sensing elements and a finger placed on a sensing surface of the sensing device. A surface of the sensing elements define a sensing plane. The sensing device further comprises a plurality of interposer structures arranged on the sensing chip extending above sensing plane, wherein the plurality of interposer structures have the same height above the sensing plane. A protective plate is attached to the sensing chip by means of an adhesive, and the protective plate rests on the interposer structures such that a distance between the protective plate and the sensing plane is defined by the height of the interposer structures.

14 Claims, 10 Drawing Sheets

FINGERPRINT SENSING DEVICE WITH INTERPOSER STRUCTURE

CROSS REFERENCE TO RELATED APPLICATIONS

This application claims the benefit of Swedish Patent Application No. 1550748-6 filed Jun. 8, 2015, and Swedish Patent Application No. 1551288-2 filed Oct. 7, 2015. The disclosures of the above applications are incorporated herein by reference in their entirety.

FIELD OF THE INVENTION

The present invention relates to a fingerprint sensing device. In particular, the present invention is related to a fingerprint sensing device comprising an interposer structure for enhancing the performance in the sensing device, and to a method for manufacturing a fingerprint sensor comprising such an interposer structure.

BACKGROUND OF THE INVENTION

As the development of biometric devices for identity verification, and in particular of fingerprint sensing devices, has lead to devices which are made smaller, cheaper and more energy efficient, the possible applications for such devices are increasing.

In particular fingerprint sensing has been adopted more and more in, for example, consumer electronic devices, due to small form factor, relatively beneficial cost/performance factor and high user acceptance.

Capacitive fingerprint sensing devices, built based on CMOS technology for providing the fingerprint sensing elements and auxiliary logic circuitry, are increasingly popular as such sensing devices can be made both small and energy efficient while being able to identify a fingerprint with high accuracy. Thereby, capacitive fingerprint sensors are advantageously used for consumer electronics, such as portable computers, tablet computers and mobile phones, e.g. smartphones.

A fingerprint sensing chip typically comprises an array of capacitive sensing elements providing a measure indicative of the capacitance between several sensing structures and a finger placed on the surface of the fingerprint sensor. The sensing chip may further comprise logic circuitry for handling addressing of the array of sensing elements.

A typical fingerprint sensor is protected so that the finger does not come in physical contact with the sensing elements. In particular, it may be desirable to arrange a glass plate on top of the sensor for protecting the sensor, or to arrange the sensor behind a display glass. By arranging elements between the sensing surface and the sensing elements, the distance between the sensing surface and the sensing elements increases which reduces the capacitive coupling between a finger placed on a sensing surface of the device and the capacitive sensing elements.

With increased distance and reduced capacitive coupling, an increasing sensitivity is required of the sensing elements, i.e. the sensing elements must be able to measure a lower capacitance. With the sensing elements being pushed to the limit with regard to the minimum measurable capacitance, it is increasingly important to ensure that the fingerprint sensor measures uniformly over the entire sensing area of the sensor.

In view of the above, it is desirable to improve the performance of a fingerprint sensor having a low capacitive coupling between a finger placed on the sensing surface and the sensing elements.

Many attempts are made at improving the capacitive coupling, for example, US2013/0201153 discloses a fingerprint sensing device where electrically conductive strands are arranged between the sensing surface and the sensing elements of a fingerprint sensing device. An insulating material is arranged between conductive strands. However, a direct electrical contact between the finger and the pixel may cause problems related to electrostatic discharge (ESD). Moreover, the metallic portions of the surface may oxidize, resulting in undesirable aesthetic effects.

SUMMARY OF THE INVENTION

In view of above-mentioned desirable properties of a fingerprint sensing device, and drawbacks of prior art, it is an object of the present invention to provide a fingerprint sensing device and a method for manufacturing a fingerprint sensing device which improves capacitive measurements for capacitances near the limit of what is measureable.

According to a first aspect of the invention, there is provided a fingerprint sensing device comprising: a sensing chip comprising an array of sensing elements, the sensing elements being configured to be connected to readout circuitry for detecting a capacitive coupling between each of the sensing elements and a finger placed on a sensing surface of the sensing device, wherein a surface of the sensing elements define a sensing plane; a plurality of interposer structures arranged on the sensing chip extending above sensing plane, wherein the plurality of interposer structures have substantially the same height above the sensing plane; and a protective plate attached to the sensing chip by means of an adhesive arranged on the sensing chip, wherein the protective plate rests on the interposer structures such that a distance between the protective plate and the sensing plane is defined by the height of the interposer structures.

The sensing chip should in the present context be understood as a chip comprising a plurality of sensing elements in the form of conductive plates or pads, typically arranged in an array, which are capable of forming a capacitive coupling between each sensing element and a finger placed on an exterior surface of the fingerprint sensing device. Through readout of the capacitive coupling for each sensing element, ridges and valleys of a fingerprint can be detected as a result of the distance dependence of the capacitive coupling. To achieve a fingerprint image with sufficient resolution, the sensing elements are typically substantially smaller than the features (ridges and valleys) of the finger. In general, a chip may also be referred to as a die.

The protective plate typically comprises a dielectric material in order to provide a good capacitive coupling between a finger placed on the plate and the sensing elements of the sensing chip. In particular, the protective plate may advantageously comprise a glass or ceramic material, such as a chemically strengthened glass, $ZrO_2$ or sapphire. The aforementioned materials all provide advantageous properties in that they are hard and thereby resistant to wear and tear, and in that they are dielectric thereby providing a good capacitive coupling between a finger placed on the surface of the protective plate and the sensing element of the sensing device. The protective plate described herein commonly forms the outer surface of the fingerprint sensing device, hereinafter referred to as the sensing surface.

The sensing chip according to various embodiments of the invention may subsequently be arranged on a conventional rigid PCB substrate or it may be implemented using a flexible type of substrate comprising readout circuitry to form the fingerprint sensing device.

The present invention is based on the realization that a more homogeneous distance distribution between the sensing surface and the sensing plane can improve the performance of a fingerprint sensing device. In particular, when a protective plate is used and the distance between the sensing surface and the sensing plane is increasing to the degree that the difference in capacitance between a fingerprint ridge and a valley is barely discernable by the sensing chip, it is increasingly important that the capacitive coupling is as homogeneous as possible over the entire surface of the sensing device.

Moreover, since a wafer coating material is sometimes provided on the sensing chip to protect and cover the sensing elements, it has been realized that the wafer coating material, if formed with a high degree of accuracy, can be used as an interposer structure defining the distance between the sensing plane and the sensing surface. The thickness of the protective plate can be controlled to a high degree of accuracy, whereas the adhesive attaching the protective plate to the sensing chip typically is more difficult to deposit evenly, thereby exhibiting a more uneven surface. Thus, the distance between the sensing surface and the sensing plane has previously been defined, at least in part, by the adhesive attaching the protective plate, which may lead to some inhomogeneity in the distance and in subsequent readout of a fingerprint image.

According to embodiments of the present invention, interposer structures exhibiting high thickness uniformity are provided on the sensing elements such that they have substantially the same height above the sensing plane. Accordingly, with the protective plate attached to the sensing chip by means of an adhesive, while resting on the interposer structures, the distance between a finger placed on the protective plate and the sensing elements can be controlled with a high degree of accuracy. In such a situation, optimal settings can be applied across the whole sensing area thereby facilitating acquisition of a fingerprint image with high quality. Furthermore, the interposer structures are preferably arranged and configured to provide sufficient mechanical support for the protective plate to avoid movement or flexing of the protective plate when the fingerprint sensor is in use.

The interposer structures can in principle be made from any commonly used wafer coating material, which may refer to any material which is arranged to cover the sensing chip and in particular the sensing elements.

According to one embodiment of the invention, a variation in height between the plurality of interposer structures may advantageously be less than 1 µm.

According to one embodiment of the invention, the plurality of interposer structures may comprise parallel lines, which would provide an assembly of interposer structures which is simple to manufacture and which could provide sufficient mechanical support for the protective plate. The specific configuration of lines, such as the length, width, pitch and orientation can be selected based on the specific configuration of the fingerprint sensor. For example the parallel lines may be aligned with an edge of the sensing chip and have a length substantially similar to the side of the sensing chip, thereby providing interposer structures which define the distance between the sensing plane and the sensing surface over the full area of the sensing chip, including at the edges of the sensing chip to avoid that any edge effects occur.

Alternatively, according to one embodiment of the invention, the plurality of interposer structures may comprise one interposer structure centered on each of said sensing elements. Thereby, it can be ensured that the distance from each individual sensing element to the sensing surface is well defined and homogeneous over the full area of the sensing chip. It should be noted that many different configurations of interposer structures are possible, while still providing the advantageous effects described above.

In one embodiment of the invention, in the case where one interposer structure is located on each of said sensing elements, the interposer structures may be formed in a material having a dielectric constant higher than a dielectric constant of the adhesive. An improved capacitive coupling between a finger and a sensing element can be achieved by providing an interposer structure having a dielectric constant which is higher than the surrounding adhesive. Thereby, the electric field between a finger placed on the sensing surface and the sensing element can be focused towards the respective sensing elements by means of the difference in dielectric constant. Accordingly, a further improved fingerprint sensing device can be provided.

According to one embodiment of the invention, the plurality of interposer structures may be arranged in alignment with boundaries between the sensing elements, such that a central portion of each sensing element is not covered by an interposer structure. For the above configuration of interposer elements, where at least a central portion of the sensing element is not covered by the interposer structure, the interposer structures may be formed in a material having a dielectric constant lower than a dielectric constant of the adhesive in order to achieve the above described effect of improved capacitive coupling between the sensing element and a finger. The adhesive will then fill the space between interposer structures such that an inhomogeneous layer is formed with respect to the dielectric constant of the materials, and where the higher dielectric constant of the adhesive provides the improved capacitive coupling.

According to one embodiment of the invention, the interposer structures may be arranged on the sensing chip at locations outside of a sensing area of the sensing chip, the sensing area being defined by the array of sensing elements. Thus, the interposer can be arranged to form a frame partially surrounding the array of sensing elements. The adhesive can then be arranged primarily within the frame formed by the interposer elements According to one embodiment of the invention, the plurality of interposer structures may comprise a photoresist. By using a photoresist, the interposer structures can be formed using conventional photolithography and development processes, which simplifies the overall process flow. Moreover, a photoresist can easily be tailored to have a specific dielectric constant so that a desired ratio of dielectric constants can be achieved.

According to one embodiment of the invention, the sensing device may further comprise a bond wire arranged between a bond pad on the sensing chip and a substrate on which the sensing chip is arranged, wherein a bond loop height of the bond wire is lower than the interposer structure. It may also be possible to have a bond wire loop height which is slightly higher than the height of the interposer structure, in which case the protective plate may push down on the bond wire when the protective plate is attached to the sensing chip.

In one embodiment of the invention, the sensing device may further comprise a via connection through said sensing chip to electrically connect the sensing chip to a substrate. A via connection, commonly referred to as a through-silicon via (TSV) connection, can be used to electrically connect the sensing chip to readout circuitry on a substrate without using wire bonding. TSV connection is for example used when wire bonding is undesirable or unpractical, such as when the desired height of the interposer structures is lower than a height of the wire bond. This situation could for example occur when the sensor shall be utilized with a very thick protective plate such as e.g. a cover glass in a mobile phone.

According to a second aspect of the invention, there is provided a method for manufacturing a fingerprint sensing device, the method comprising; providing a sensing chip comprising an array of sensing elements, the sensing elements being configured to be connected to readout circuitry for detecting a capacitive coupling between each of the sensing elements and a finger placed on a sensing surface of the sensing device, wherein a surface of the sensing elements define a sensing plane; forming an interposer layer on the sensing chip; forming a plurality of interposer structures from the interposer layer, wherein the plurality of interposer structures have substantially the same height above the sensing plane; providing a liquid adhesive on the sensing chip; and arranging a protective plate on the sensing chip such that the adhesive is filling out spaces between the plurality of interposer structures, and such that the protective plate rests on the interposer structures.

Through the above described manufacturing method, a fingerprint sensing device can be manufactured which exhibits the advantages described above in connection with the first aspect of the invention.

That the adhesive is liquid should be interpreted to mean that it has a fluidity which is sufficiently high to allow redistribution of the adhesive when the protective plate is arranged on the sensing chip. The protective plate is pressed down onto the sensing chip until it rests on the interposer structures, thereby defining the distance between the sensing elements and the sensing surface. Through the redistribution of the adhesive it can be assured that voids between interposer structures are filled and that superfluous adhesive is pushed out to the sides of the sensing chip.

According to one embodiment of the invention, the interposer layer may be deposited by spin coating or by spray coating which are methods that allow a high degree of accuracy and thickness uniformity when depositing the interposer layer. Moreover, spin and spray coating represent established methods which are compatible with conventional CMOS processing technologies, thereby providing a controllable manufacturing process which is easily integrated in existing manufacturing processes.

In one embodiment of the invention, providing the adhesive may comprise dispensing a liquid adhesive on and in between said interposer structures. A liquid adhesive can easily be dispensed onto the sensing chip, over and in between the interposer structures. The uniformity when dispensing the adhesive is not crucial since the adhesive will be redistributed when the protective plate is pressed down onto the adhesive.

According to one embodiment of the invention, the interposer layer may advantageously comprise a photoresist, and the plurality of interposer structures can thus be formed using photolithography, which is a well established manufacturing technique that can be performed with high accuracy, uniformity and repeatability.

According to one embodiment of the invention, the method may comprise the steps of depositing a hard mask on the interposer layer, patterning the hard mask, patterning the interposer layer according to the hard mask pattern, and removing the hard mask. Thereby, an alternative manufacturing technique is provided. The hard mask can for example be made from SiN and conventional photolithography may be used to form a pattern in the hard mask which is subsequently transferred to the interposer layer.

According to a third aspect of the invention, there is provided a method for manufacturing a fingerprint sensing device, comprising: providing a semiconductor wafer, on the semiconductor wafer forming a plurality of fingerprint sensing chips, each sensing chip comprising an array of sensing elements, the sensing elements being configured to be connected to readout circuitry for detecting a capacitive coupling between each of the sensing elements and a finger placed on a sensing surface of the sensing device, wherein a surface of the sensing elements define a sensing plane; forming an interposer layer on the semiconductor wafer, the interposer layer covering the plurality of fingerprint sensing chip sub-areas; forming a plurality of interposer structures from the interposer layer, wherein the plurality of interposer structures have substantially the same height above the sensing plane; dicing the semiconductor wafer into a plurality of individual sensing chips; arranging a sensing chip on a substrate comprising readout circuitry; electrically connecting the sensing elements of the sensing chip to the readout circuitry; providing a liquid adhesive on the sensing chip; and arranging a protective plate on the sensing chip such that the adhesive is filling out spaces between the plurality of interposer structures, and such that the protective plate rests on the interposer structures.

An advantage of the above described method is that an interposer layer can be deposited on a full wafer with a high uniformity using established deposition techniques such as spin coating, thereby providing a more effective manufacturing method where a large number of sensing chips can be prepared simultaneously. Moreover, using spin coating or spray coating also allows the process to be easily modified with respect to the desired thickness of the interposer layer.

Further features of, and advantages with, the present invention will become apparent when studying the appended claims and the following description. The skilled person will realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of a fingerprint sensing device according to the present invention are mainly discussed with reference to a capacitive fingerprint sensing device. A method for manufacturing a fingerprint sensing device is also discussed.

Figure 1:
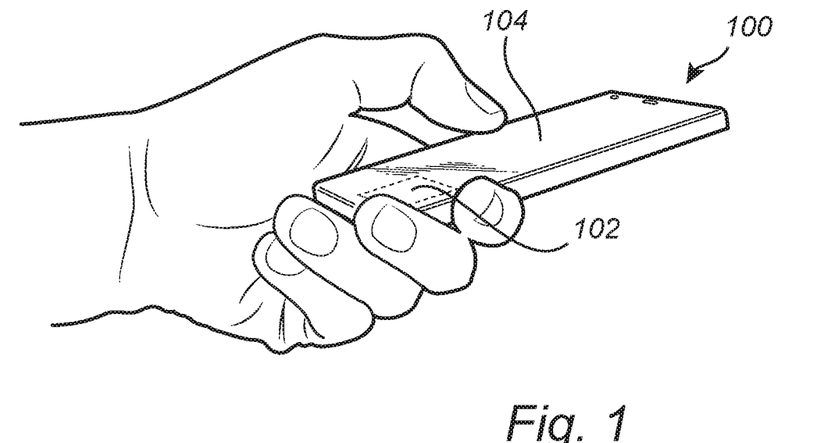
FIG. 1 schematically illustrates a handheld electronic device comprising a fingerprint sensing device according to an embodiment of the invention.

FIG. 1 is a schematic illustration of a handheld device 100 comprising a fingerprint sensing device 102 comprising a touchscreen display 104. A fingerprint sensing device 102 can be used in for example a mobile phone, a tablet computer, a portable computer or any other electronic device requiring a way to identify and/or authenticate a user.

Figure 2A:
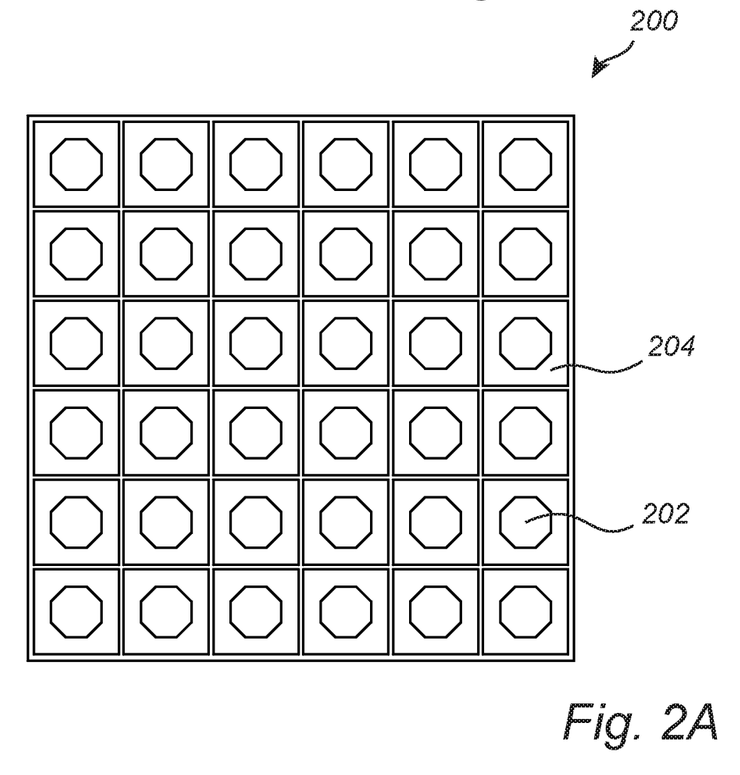
FIGS. 2A-B schematically illustrate a fingerprint sensing device according to an embodiment of the invention.

FIG. 2A is a schematic illustration of a fingerprint sensing device 200 according to an embodiment of the invention, as seen in a top view. In particular, FIG. 2A illustrates the outline of a plurality of interposer structures 202, where each interposer structure 202 is arranged on a sensing element 204 of the sensing device 200.

Figure 2B:
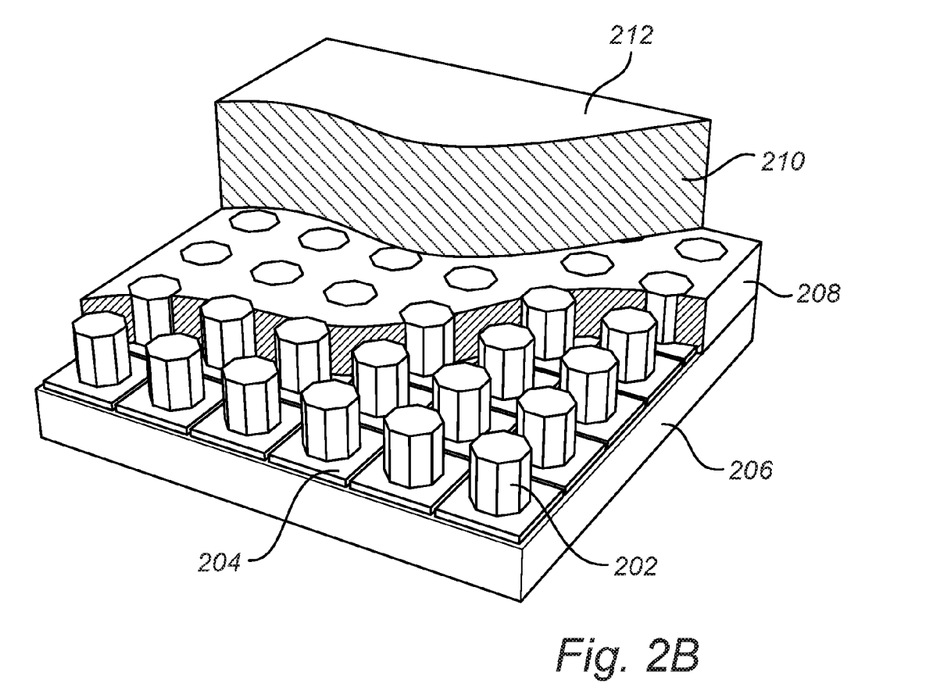

FIG. 2B illustrates the sensing device 200 in further detail where a sensing chip 206 comprising an array of sensing elements 204 is shown. Here it can be seen that an adhesive 208 is arranged in the space between interposer structures 202, and that a protective plate 210 is attached to the sensing device 200 by means of the adhesive 208. The protective plate 210 can be manufactured with a high degree of accuracy, and the variation in thickness over the sensing area is typically less than 2 µm. Moreover, the distance between the surface of the sensing elements 204 and the surface 212 of the protective plate 208, is defined by the height of the interposer structures 202. The height of the interposer structures is typically in the range of 5 to 50 µm. The height the of the interposer structures for a specific application can for example be selected based on the bonding technique used to connect the sensing chip to a substrate, or on the type of adhesive used. The surface plane of the sensing elements 204 is defined as the sensing plane, and the surface 212 of the protective plate 210 is defined as the sensing surface 212.

The protective plate 210 may also be the cover glass in a device comprising a touch screen, and a cover glass covering the fingerprint sensing device may also be covering the display and touchscreen portions of the handheld device. In principle, the protective plate may be any structure which acts to cover and protect the sensing device while still allowing a capacitive coupling between a finger placed on the surface of the protective plate and the sensing elements.

The sensing elements 204 are here shown arranged in a square array, the sensing elements having a size of about 50×50 µm and a distance between adjacent elements is about 5 µm. The sensing elements 204 are electrically conductive, typically metallic, and can as a general approximation be considered to act as one plate in a parallel plate capacitor, where a finger placed on a sensing surface 212 of the fingerprint sensing device 200 represents the other plate. Each sensing element 204 is connected to readout circuitry (not shown) for detecting a capacitive coupling between each of said sensing elements 204 and a finger placed on the sensing surface 212.

Figure 3A:
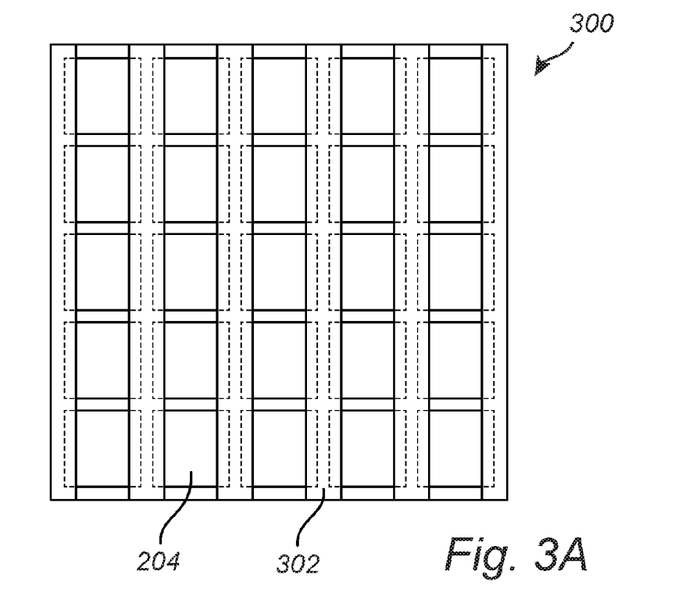
FIGS. 3A-B schematically illustrate a fingerprint sensing device according to an embodiment of the invention.

FIG. 3A is a schematic illustration of a fingerprint sensing device 300 according to an embodiment of the invention where the interposer structures 302 are provided in the form of parallel lines, or ridges, aligned with the boundaries between sensing elements 204.

Figure 3B:
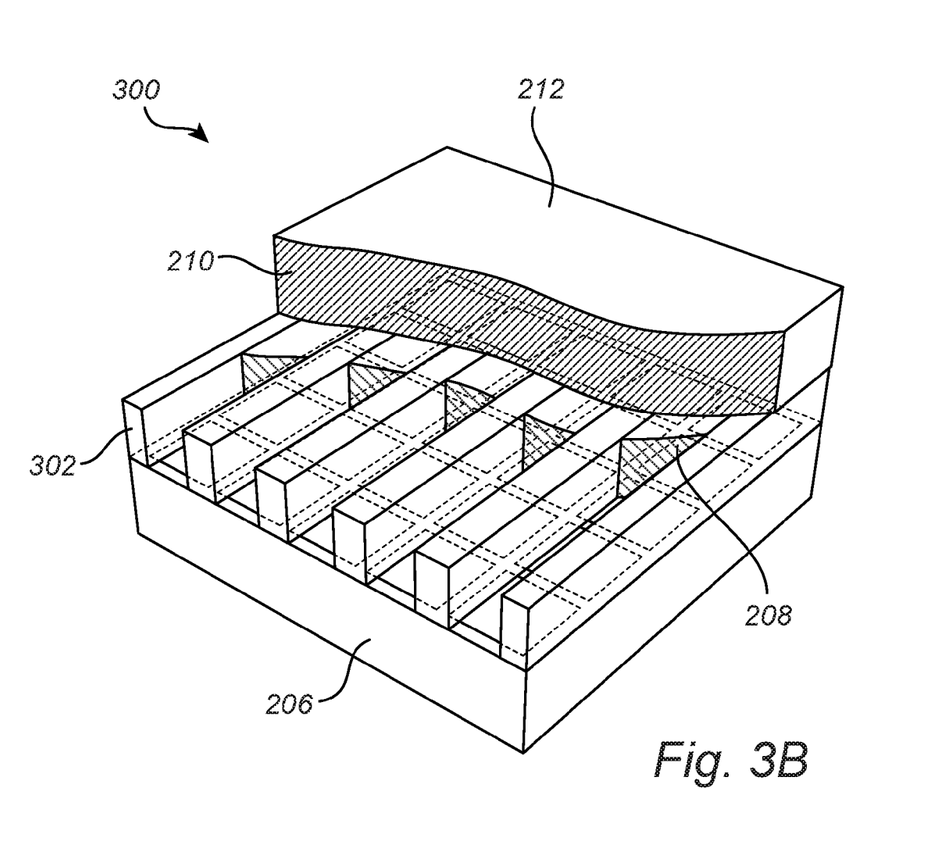

In FIG. 3B it can be seen that the adhesive is arranged to fill out the space between the ridges 302 and to attach the protective plate 210 to the sensing chip 206.

Figure 4A:
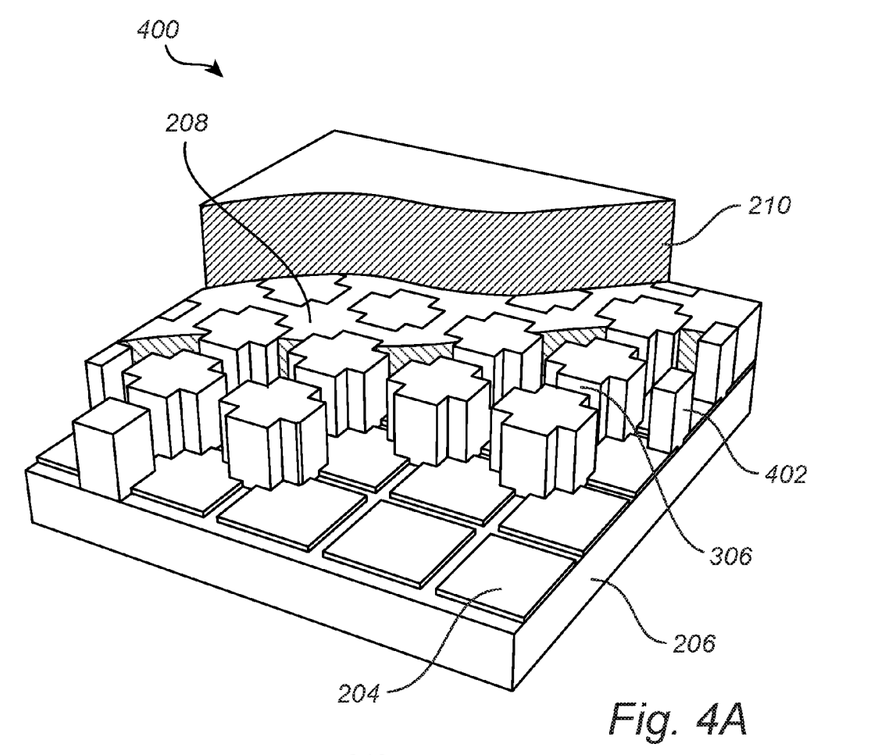
FIGS. 4A-B schematically illustrates fingerprint sensing devices according to embodiments of the invention.

FIG. 4A is schematic illustration of an alternative embodiment of a fingerprint sensing device 400 where interposer structures 402 are arranged aligned with boundaries between adjacent sensing elements 204 but with a gap or opening 306 in the interposer structures 402 between adjacent interposer structures 402.

Figure 4B:
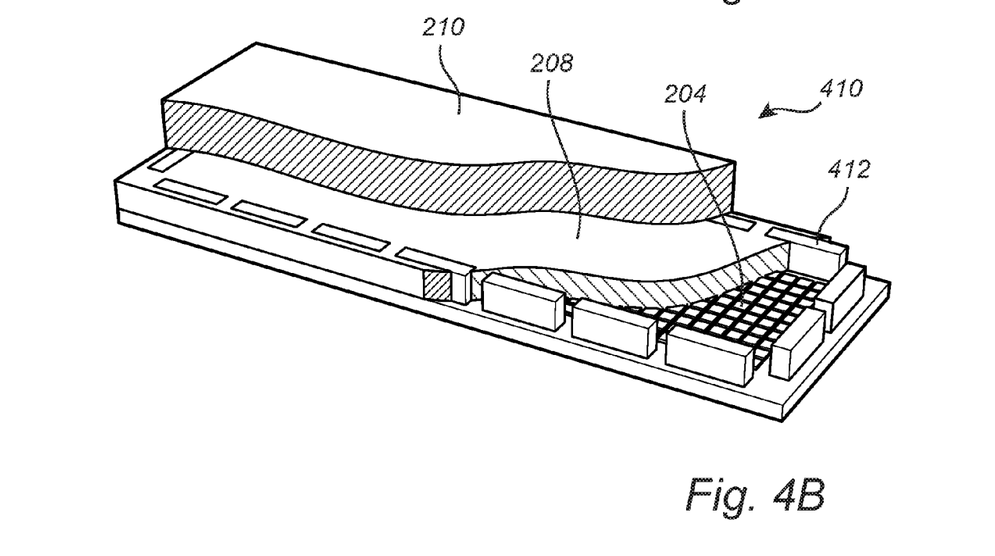

FIG. 4B is schematic illustration of an alternative embodiment of a fingerprint sensing device 410 where interposer structures 412 are arranged on the sensing chip outside of the array of sensing elements 204, which defines the sensing area. Thereby, the adhesive 208 can be arranged to completely cover the sensing elements 204, providing a homogeneous covering layer. As can be seen in FIG. 4B, there is a space between adjacent interposer structures 412 enabling a liquid adhesive to flow out through the gaps formed between the structures when the adhesive is deposited. Thereby, any additional adhesive can be pushed out outside of the interposer structures 412 when the protective plate 210 is arranged on the sensing device 410 so that the protective plate 210 rests on the interposer structures 412. It should be noted that the configuration illustrated in FIG. 4B is one of many possible configurations for the interposer structures, and that many different configurations of the interposer elements are possible, where the main feature is that the interposer structures are all of the same height and that they provide mechanical support for the protective plate.

An advantage of providing interposer structures as illustrated in FIGS. 2-4 above is that when a liquid adhesive is being dispensed, the adhesive can easily flow out and fill all the spaces between interposer structures, thereby forming a homogeneous layer without air gaps, which in turn leads to a well defined dielectric structure between the sensing elements 204 and the sensing surface 212. The adhesive may for example have the same dielectric constant as the material from which the interposer structures are made, thereby making the layer comprising the interposer structures and the adhesive behave as a uniform layer in a dielectric perspective.

Alternatively, it is possible to use an adhesive and an interposer structure having different dielectric constants, in which case the difference in dielectric constant can be used to focus the electric field towards the sensing elements. This requires that the material located directly above each sensing element should have a higher dielectric constant than the surrounding material. Taking the sensing device 200 of FIGS. 2A-B as an example, the interposer structures 202 would need to have a dielectric constant which is higher than the dielectric constant of the adhesive 208 to achieve the field focusing effect.

Figure 5:
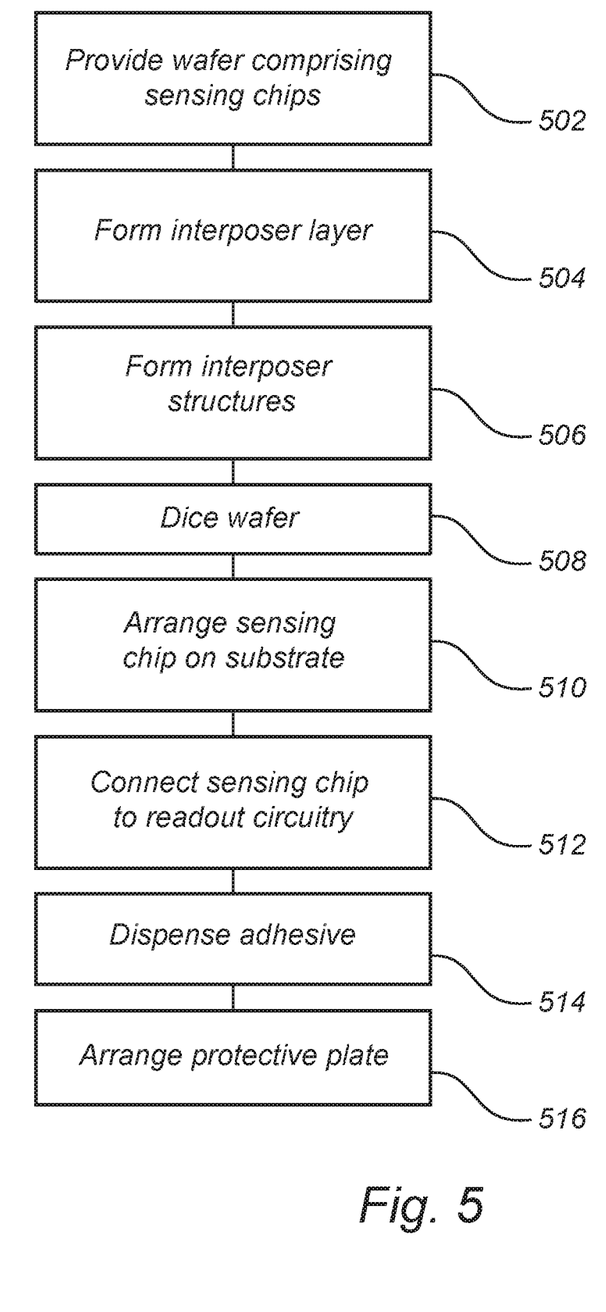
FIG. 5 is a flow chart outlining the general steps of a method for manufacturing a fingerprint sensing device according to an embodiment of the invention.

FIG. 5 is a flow chart outlining the general steps of a manufacturing method according to an embodiment of the invention. The manufacturing method will be discussed also with reference to FIGS. 6A-G.

Figure 6A:
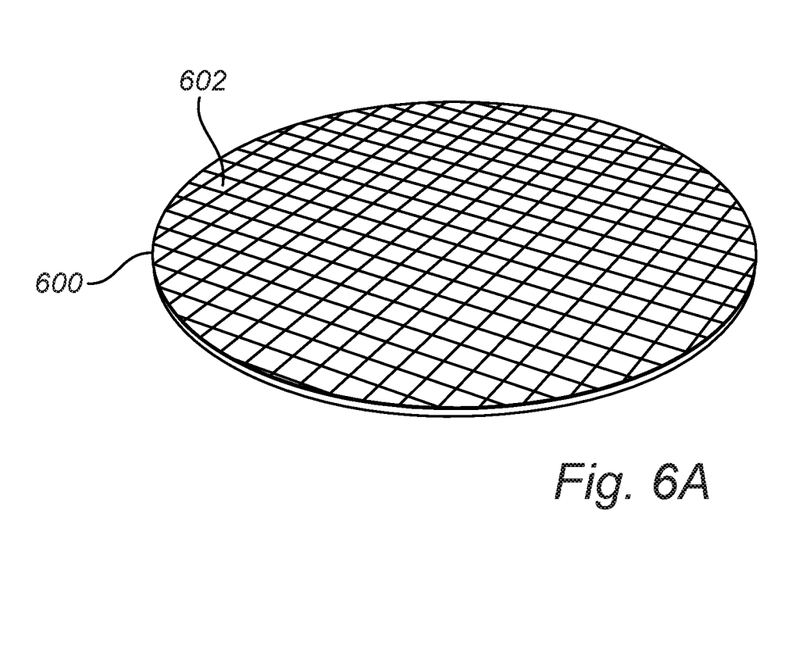
FIGS. 6A-G schematically illustrate a method for manufacturing a fingerprint sensing device according to an embodiment of the invention.

First, in step 502 illustrated in FIG. 6A, a circular wafer 600 comprising a plurality of sensing chips 602 is provided. The wafer 600 may for example be a silicon wafer where sensing chips 602 have been formed using conventional CMOS-compatible processing. By using a full size circular wafer, large scale processing advantages can be achieved.

Figure 6B:
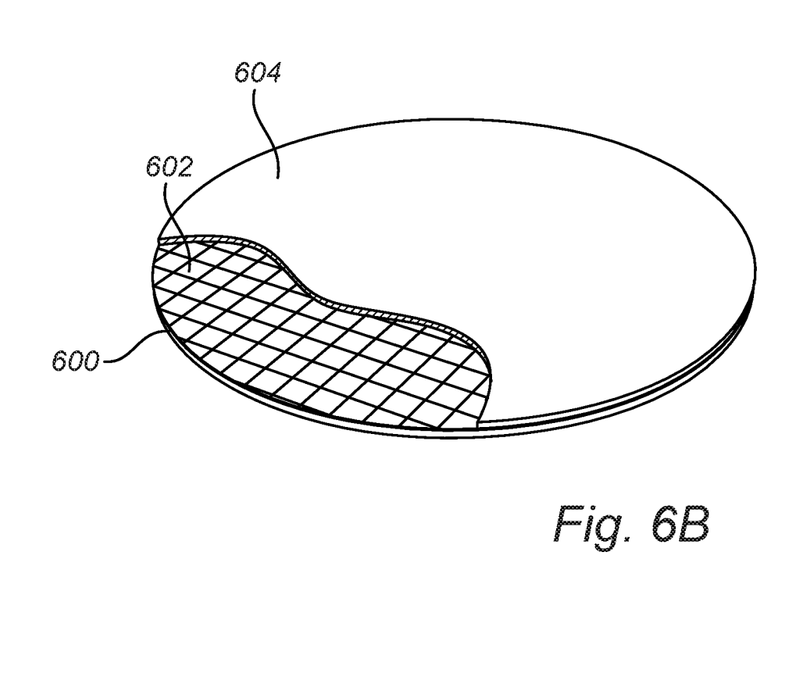

Next 504, as illustrated in FIG. 6B, an interposer layer 604 is formed on the surface of the wafer 600, thereby covering the sensing chips 602 to form a uniform layer on the surface of the wafer 600. The interposer layer 604, which may also be referred to as a coating layer, is formed to have a uniform thickness and to cover the entire area of the wafer 600. The interposer layer 604 can for example be a photoresist deposited by spin-coating or spray coating, and the photoresist may be either a positive or a negative photoresist. Spin- and spray-coating are well established manufacturing techniques which can be performed with high accuracy on wafer scale, thereby providing an interposer layer 604 having a uniform thickness over the surface of the wafer 600. To achieve a high homogeneity in the deposited layer, spray coating can advantageously be performed using ultrasonic nozzles. Furthermore, it is also possible to use methods such as inkjet printing or 3D-printing to form the interposer structures.

Figure 6C:
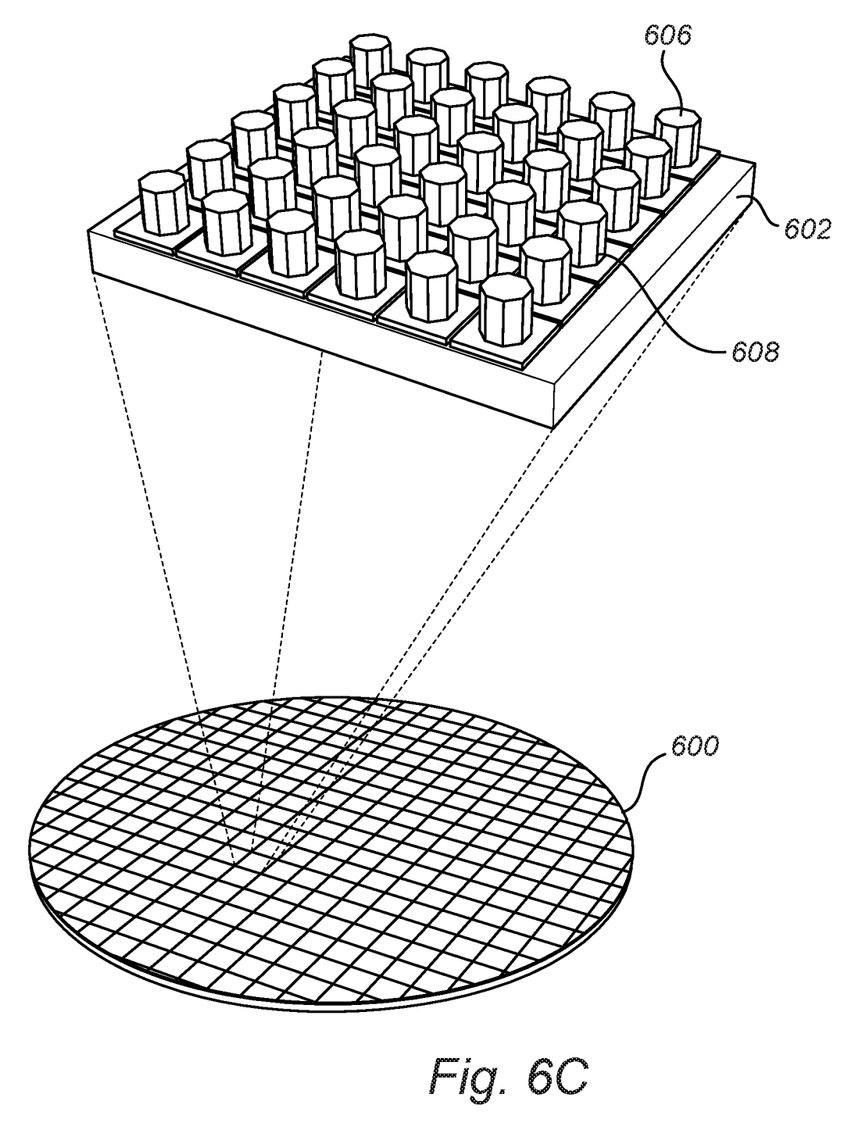

In the next step 506, illustrated in FIG. 6C, interposer structures 606 are formed on the surface of the wafer using photolithography. Here, the interposer structures are provided in the form of individual structures where each structure 606 is centered on a corresponding sensing element 608. The cross section of the interposer structure 606 is illustrated as being substantially hexagonal. However, the cross section of the interposer structure may in principle be selected arbitrarily, and it may be circular, quadratic or have any polygonal shape there between. Moreover, it is not required that the interposer structure is symmetric, nor does it need to be symmetric in the vertical direction.

As an alternative to using a photoresist to form the interposer structures as described above, it is also possible to form the interposer structures in another material. As an example, a hard mask may be formed on the wafer, for example a SiN mask, after which the hard mask is patterned using photolithography, patterning and subsequent deep reactive ion etching (DRIE). It is also possible to use laser ablations to remove material in selected areas to form the desired patterns of interposer structures. Moreover, it is also possible to use additive techniques for the purpose of fabricating the interposer structures and associated geometries, such as e.g. inkjet printing or 3D printing.

After forming the interposer structures, the interposer layer may be treated in a plasma cleaning process in order to improve adhesion between the interposer structures and the subsequently deposited adhesive. The plasma cleaning may for example comprise oxygen mixed with an inert gas such as nitrogen or argon.

Figure 6D:
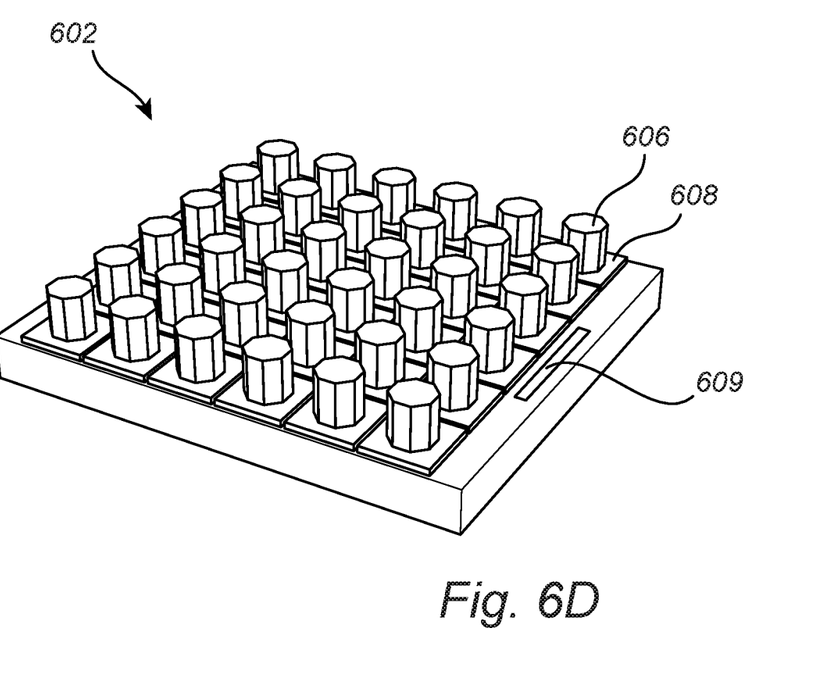
Figure 6E:
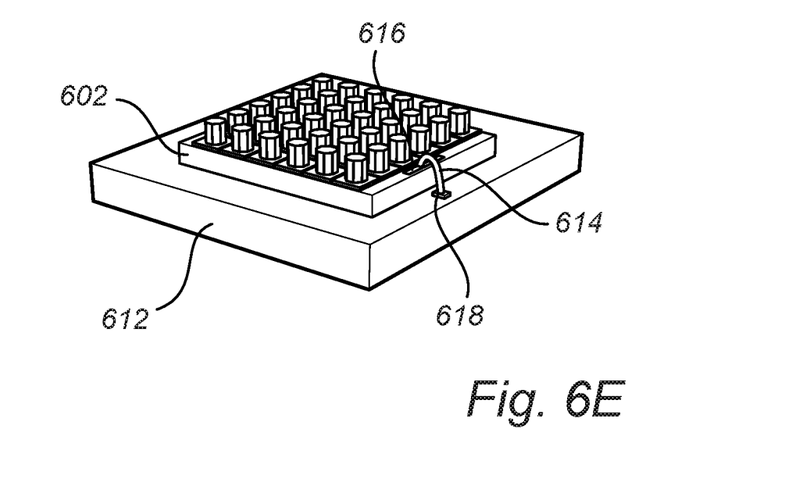

After forming the interposer structures 606 on the wafer, the wafer is diced 508 into separate sensing chips 602 illustrated in FIG. 6D. FIG. 6D further illustrates a bond pad 609 on the sensing chip 602 subsequently used to electrically connect the sensing chip 602 to a substrate. As illustrated in FIG. 6E, the individual sensing chips 602 are subsequently arranged 510 onto corresponding substrates 612 comprising readout circuitry (not shown) for reading out the information from the sensing elements 608 of the sensing chip 602 in order to form a fingerprint image. The sensing chip 602 is connected 512 to the substrate 612 by means of a bond wire 614 reaching from a first bond pad 616 on the sensing chip to a second bond pad 618 on the substrate. Here, only one bond wire is illustrated to avoid cluttering the drawings.

Figure 6F:
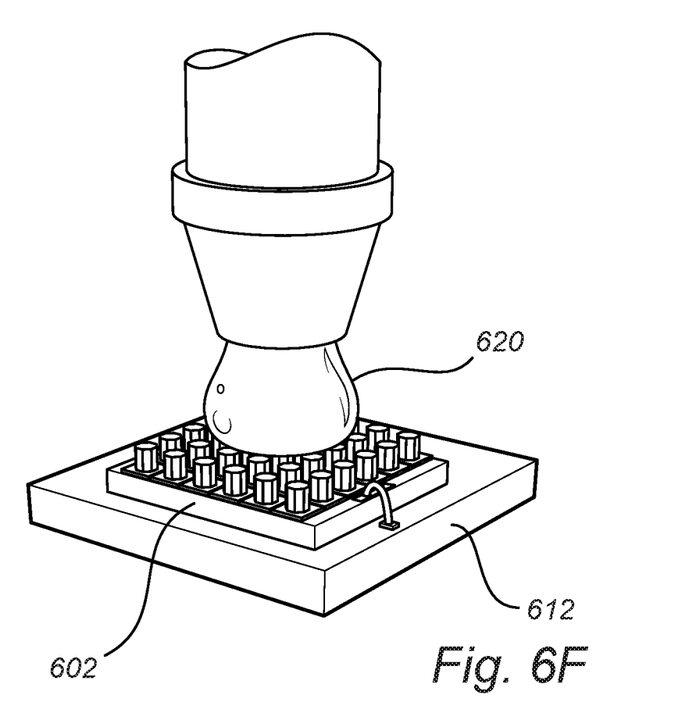

As a next step 514, illustrated in FIG. 6F, a liquid adhesive 620 is provided 514 by dispensing the adhesive 620 onto the interposer layer so that the adhesive 208 fills the spaces between the interposer structures 606.

Figure 6G:
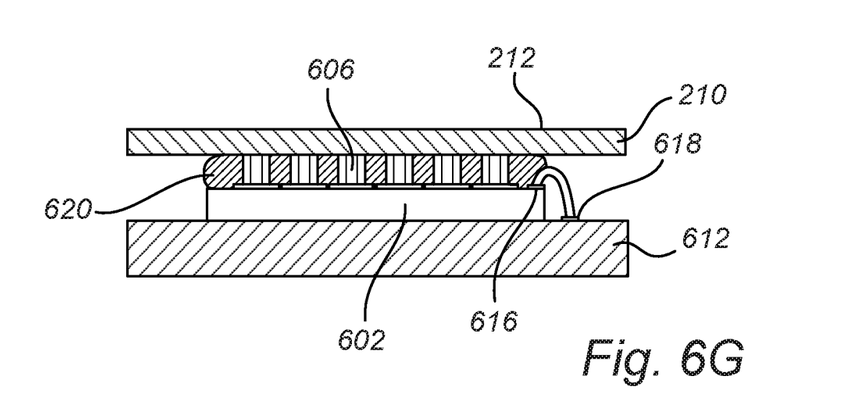

In the final step 516 as illustrated in FIG. 6G, a protective plate 210 is attached to the sensing device by means of the adhesive 208. The protective plate 210 is arranged onto the adhesive 620 and a certain pressure is applied so that the adhesive 620 is redistributed to fill all the spaces between adjacent interposer structures 606. The protective plate is pressed down until it rests on the interposer structures. After the step of applying the adhesive on the sensing chip, there could be a drying step involved (sometimes referred to as beta stage curing) to partially dry the adhesive. In case of curing, the protective plate can be attached to the partially cured/dried adhesive in a subsequent assembly step by applying heat and pressure.

Figure 7:
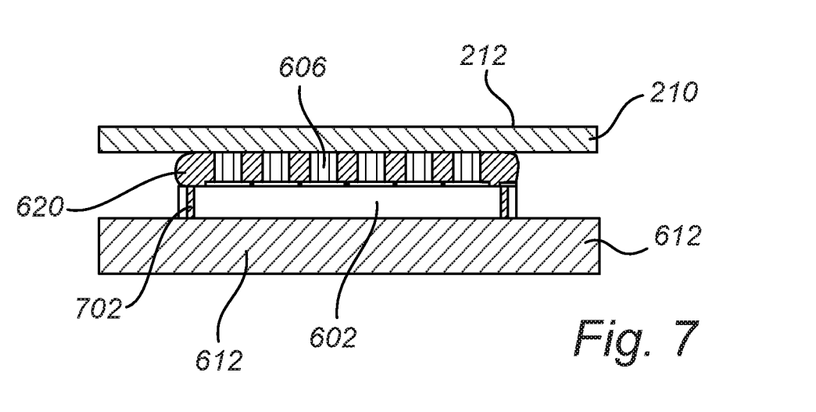
FIG. 7 schematically illustrates a fingerprint sensing device according to an embodiment of the invention.

FIG. 7 illustrates a sensing device where the electrical connection between the sensing elements and the substrate 612 is formed using a via connection 702 through the sensing chip 602. Such a via connection 702 may also be referred to as a through silicon via (TSV) connection.

Even though the above method is illustrated as starting from a full wafer, it is equally possible to form the interposer structures on an already diced sensing chip.

Moreover, the protective plate may also be provided with a frame, which may also be referred to as a bezel, surrounding the sensing chip once the protective plate is in place. The bezel may for example help to protect the bond wires between the sensing chip and the substrate. The bezel may also be a conductive structure acting as a drive element for a finger, and/or functioning as an ESD discharge node.

It should be noted that the general aspects of the invention discussed herein are not limited to the specific dimensions and sizes disclosed in the present description. The above description merely provides an example embodiment of the inventive concepts as defined by the claims.

Even though the invention has been described with reference to specific exemplifying embodiments thereof, many different alterations, modifications and the like will become apparent for those skilled in the art. Also, it should be noted that parts of the device and method may be omitted, interchanged or arranged in various ways, the device and method yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A fingerprint sensing device comprising:
    a sensing chip comprising an array of sensing elements, said sensing elements being configured to be connected to readout circuitry for detecting a capacitive coupling between each of said sensing elements and a finger placed on a sensing surface of said sensing device, wherein a surface of said sensing elements define a sensing plane;
    a plurality of interposer structures arranged on said sensing chip extending above said sensing plane, wherein said plurality of interposer structures have the same height above said sensing plane, wherein said plurality of interposer structures are arranged in alignment with boundaries between said sensing elements, such that a central portion of each sensing element is not covered by an interposer structure; and a protective plate attached to said sensing chip by means of an adhesive arranged on said sensing chip, wherein said protective plate rests on said interposer structures such that a distance between said protective plate and said sensing plane is defined by the height of said interposer structures, wherein said plurality of interposer structures are formed of a material having a dielectric constant lower than a dielectric constant of said adhesive.

2. The sensing device according to claim 1, wherein a variation in height between said plurality of interposer structures is less than 1 µm.

3. The sensing device according to claim 1, wherein said plurality of interposer structures comprises parallel lines.

4. The sensing device according to claim 3, wherein said parallel lines are aligned with an edge of said sensing chip and have a first length the same as a second length of a side of the sensing chip.

5. The sensing device according to claim 1, wherein said interposer structures are arranged on said sensing chip at locations outside of a sensing area of said sensing chip, said sensing area being defined by said array of sensing elements.

6. The sensing device according to claim 1, wherein said plurality of interposer structures comprises a photoresist.

7. The sensing device according to claim 1, further comprising a bond wire arranged between a bond pad on said sensing chip and a substrate on which the sensing chip is arranged, wherein a bond loop height of said bond wire is lower than said plurality of interposer structures.

8. The sensing device according to claim 1, further comprising a via connection through said sensing chip to electrically connect said sensing chip to a substrate.

9. A fingerprint sensing device comprising:
a sensing chip comprising an array of sensing elements, said sensing elements being configured to be connected to readout circuitry for detecting a capacitive coupling between each of said sensing elements and a finger placed on a sensing surface of said sensing device, wherein a surface of said sensing elements define a sensing plane;

a plurality of interposer structures arranged on said sensing chip extending above said sensing plane, wherein said plurality of interposer structures have the same height above said sensing plane, and wherein said plurality of interposer structures comprises one interposer structure centered on each of said sensing elements; and a protective plate attached to said sensing chip by means of an adhesive arranged on said sensing chip, wherein said protective plate rests on said interposer structures such that a distance between said protective plate and said sensing plane is defined by the height of said interposer structures.

10. The sensing device according to claim 9, wherein a variation in height between said plurality of interposer structures is less than 1 µm.

11. The sensing device according to claim 9, wherein said plurality of interposer structures are formed of a material having a dielectric constant higher than a dielectric constant of said adhesive.

12. The sensing device according to claim 9, wherein said plurality of interposer structures comprises a photoresist.

13. The sensing device according to claim 9, further comprising a bond wire arranged between a bond pad on said sensing chip and a substrate on which the sensing chip is arranged, wherein a bond loop height of said bond wire is lower than said plurality of interposer structures.

14. The sensing device according to claim 9, further comprising a via connection through said sensing chip to electrically connect said sensing chip to a substrate.

* * * * *